US007502232B2

(12) United States Patent
Ahn

(10) Patent No.: US 7,502,232 B2
(45) Date of Patent: Mar. 10, 2009

(54) PLASMA DISPLAY APPARATUS

(75) Inventor: Joong-Ha Ahn, Suwon-si (KR)

(73) Assignee: Samsung SDI Co., Ltd., Suwon (KR)

(*) Notice: Subject to any disclaimer, the term of this patent is extended or adjusted under 35 U.S.C. 154(b) by 612 days.

(21) Appl. No.: 11/086,740

(22) Filed: Mar. 23, 2005

(65) Prior Publication Data

US 2005/0212426 A1 Sep. 29, 2005

(30) Foreign Application Priority Data

Mar. 24, 2004 (KR) ..................... 10-2004-0019958

(51) Int. Cl.
*H05K 7/14* (2006.01)
*H05K 7/18* (2006.01)

(52) U.S. Cl. ....................... 361/801; 313/582; 361/688; 361/681

(58) Field of Classification Search ............. 313/44-47, 313/582-587; 361/681, 688, 800, 816, 831, 361/801; 362/294; 315/169.4; 345/200
See application file for complete search history.

(56) References Cited

U.S. PATENT DOCUMENTS 5,705,860 A * 1/1998 Ninh et al. .................... 307/91
5,971,566 A 10/1999 Tani et al. ................... 362/294
6,477,039 B2 * 11/2002 Tajima ....................... 361/681
6,633,126 B1 * 10/2003 Tsai et al. ................... 313/582
2003/0071551 A1 * 4/2003 Kim et al. ..................... 313/46
2003/0094296 A1 * 5/2003 Kojima et al. ........ 174/35 OMS
2003/0102789 A1 * 6/2003 Kim et al. ..................... 313/44
2003/0169573 A1 * 9/2003 Irie et al. .................... 361/752

FOREIGN PATENT DOCUMENTS

JP 10-319863 12/1998
JP 2000-183572 6/2000
JP 2000-200978 7/2000
JP 2003-029647 1/2003

OTHER PUBLICATIONS http://www.m-w.com.*

* cited by examiner

*Primary Examiner*—Nimesh Patel
*Assistant Examiner*—Jose M Diaz
(74) *Attorney, Agent, or Firm*—H.C. Park Associates, PLC

(57) ABSTRACT

A plasma display apparatus including a PDP, a supporting plate behind the PDP, and joining members connecting the PDP and the supporting plate by passing through the PDP and the supporting plate. The supporting plate supports the PDP and includes a reinforcing frame having at least one opening facing an area surrounded by the edge of the PDP and a molding encompassing the reinforcing frame to close the opening.

19 Claims, 5 Drawing Sheets

PLASMA DISPLAY APPARATUS

CROSS REFERENCE TO RELATED APPLICATION

This application claims priority to and the benefit of Korean Patent Application No. 10-2004-0019958, filed on Mar. 24, 2004, which is hereby incorporated by reference for all purposes as if fully set forth herein.

BACKGROUND OF THE INVENTION

1. Field of the Invention

The present invention relates to a plasma display apparatus, and in particular, to a plasma display apparatus having an improved structure for housing a plasma display panel.

2. Discussion of the Background

Generally, a plasma display apparatus uses plasma generated by gas discharge to produce an image on a plasma display panel (PDP), and the apparatus generates much heat during operation.

Therefore, heat dissipation from the PDP is essential for the display apparatus' proper operation. The PDP is typically attached to a chassis base, which may be made of a material having high thermal conductivity, and a thermal conduction medium, such as a heat dissipation sheet or gel, may be inserted between the PDP and the chassis base. The heat generated from the PDP may be externally dissipated via the thermal conduction medium and the chassis base.

U.S. Pat. No. 5,971,566 discloses a thermal conduction medium placed between the PDP and the chassis base, and an attachment means, such as a double-sided tape, is positioned along the PDP's perimeter. Then, the PDP and the chassis base may be combined by pressing them together.

Generally, the chassis base may be made of a strong, thermally conductive die-cast metal, such as aluminum, to support the PDP and its mounted circuit boards, as well as to dissipate heat efficiently. Japanese Laid Open Patent Publication No. 2000-183572 discloses a chassis base having a plurality of ribs for reinforcement, and Japanese Laid Open Patent Publication No. 2000-200978 shows a chassis base having a plurality of pockets for stress distribution.

However, with the conventional plasma display apparatus, the chassis base's 2-dimensional structure may increase the apparatus' weight and manufacturing cost due to the base's complicated die-casting and large amount of material used. Further, the double-sided tape connecting the PDP and the chassis base may loosen under hot and humid conditions. Also, the thermal conduction medium may limit efficient heat dissipation due to its low thermal conductivity.

SUMMARY OF THE INVENTION

The present invention provides a plasma display apparatus that may be lighter and cheaper to manufacture.

The present invention also provides a plasma display apparatus that may be assembled more accurately and securely.

The present invention also provides a plasma display apparatus that may have enhanced heat dissipation from the PDP and circuit boards.

Additional features of the invention will be set forth in the description which follows, and in part will be apparent from the description, or may be learned by practice of the invention.

The present invention discloses a plasma display apparatus including a PDP, a supporting plate behind the PDP, and joining members connecting the PDP and the supporting plate by passing through the PDP and the supporting plate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Figure 1:
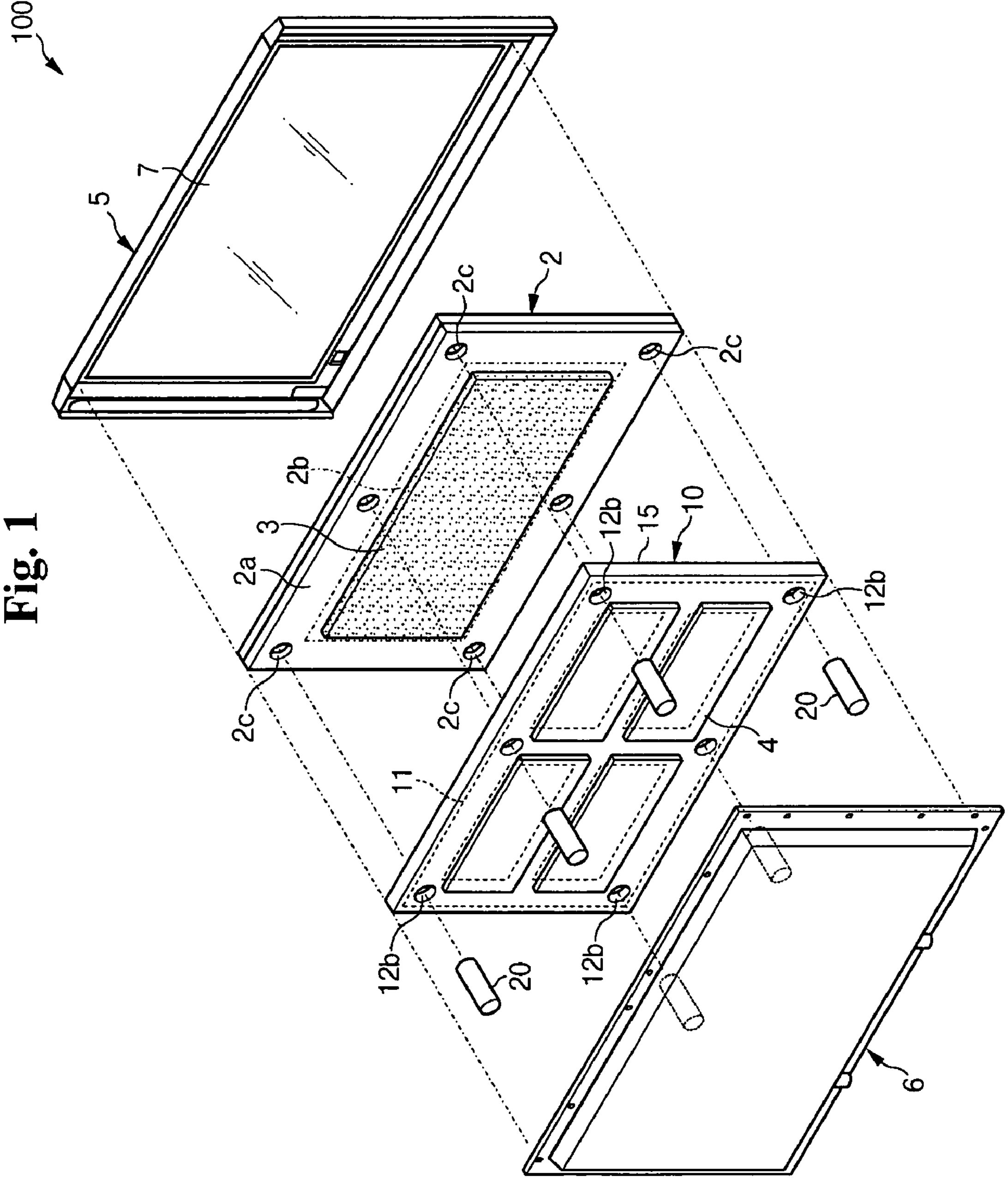
FIG. 1 is an exploded perspective view showing a plasma display apparatus according to a first exemplary embodiment of the present invention.

Referring to FIG. 1, in a first exemplary embodiment of the present invention, a plasma display apparatus 100 may include a PDP 2, a supporting plate 10 having a plurality of driving boards 4 and supporting the PDP 2, joining members 20 coupling the PDP 2 and the supporting plate 10, a front cabinet 5 in front of the PDP 2, and a rear cover 6 at the rear of, and covering, the supporting plate 10.

The front cabinet 5 may have a conductive film filter 7, which contacts the surface of the PDP 2. The rear cover 6 encompasses the supporting plate 10 with the front cabinet 5, and it may be fixed to the supporting plate 10 by screws (not shown) to form the plasma display apparatus.

The PDP 2 produces an image by exciting phosphors with vacuum ultraviolet rays generated from gas discharge within the panel. The PDP 2 may have a rectangular shape with a pair of long edges and a pair of short edges. The back side of the PDP 2 may be divided into two areas: a first area 2*a*, which is outside the dot-dashed lines in FIG. 1, and a second area 2*b*, which is inside the dot-dashed lines. A connecting hole 2*c*, which is for a joining member 20, may be formed at corners of the first area 2*a*. The joining member 20 may be a cylindrical shaped pin that passes through the connecting hole 2*c* of the PDP 2 and an edge of the supporting plate 10 to hold the PDP 2 and the supporting plate 10. The joining member 20 is not limited to the above-mentioned shape as it may have various shapes, and it may be other type fasteners.

The supporting plate 10 is strong enough to support the PDP 2, it holds the driving boards 4 thereon, and it reduces electromagnetic interference (EMI) from the PDP 2 and the driving boards 4. The supporting plate 10 may be positioned parallel to the PDP 2, and a thermal conduction medium 3, which may have a sheet configuration, may be placed therebetween. The thermal conduction medium 3 may be a heat dissipation sheet made from silicone having a high thermal conductivity, and it may be attached at the second area 2*b* of the back side of the PDP 2 facing the supporting plate 10.

Figure 2:
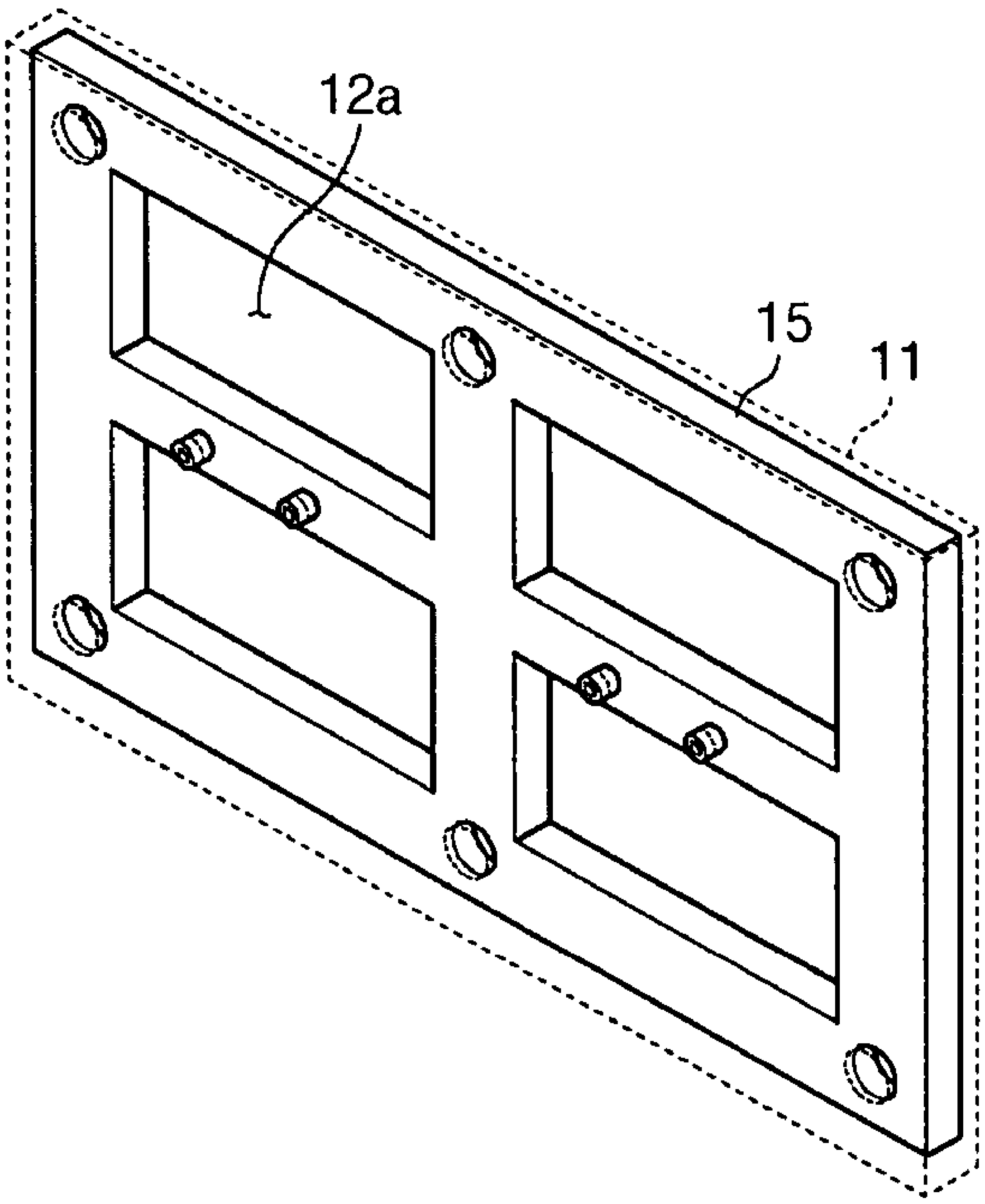
FIG. 2 is a perspective view showing the supporting plate with the molding of the plasma display apparatus of FIG. 1.

In accordance with the first exemplary embodiment of the present invention, as FIG. 2 shows, the supporting plate 10 may include a reinforcing frame 11, which substantially supports the PDP 2, and a molding 15, which encompasses the entire reinforcing frame 11.

Figure 4:
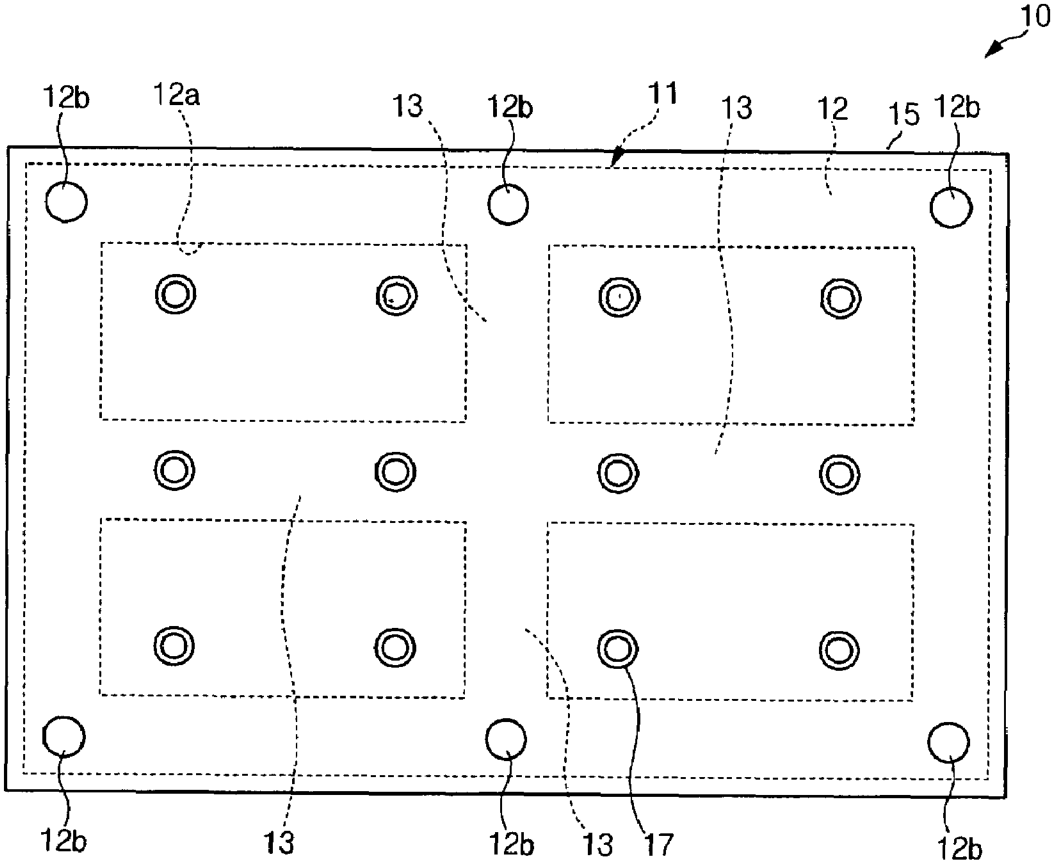
FIG. 4 is a plan view showing the supporting plate of FIG. 1.

Referring to FIG. 4, the reinforcing frame 11 may be made of a metallic material, such as aluminum, copper, steel, or other like materials, having the strength to support the PDP 2. The reinforcing frame 11 may include an opening 12*a* facing the PDP's second area 2*b*, an outer frame 12 facing the PDP's first area 2*a*, and a supporting frame 13, extending from the outer frame 12 toward the center of the opening 12*a*, to divide the opening 12*a* into at least two openings 12*a*.

The outer frame 12 corresponds to the PDP's first area 2*a* and forms a single opening 12*a* inside the outer frame 12. The supporting frame 13 corresponds to the PDP's second area 2*b*, and as FIG. 4 shows, it may have a cross (+) shape that extends from the outer frame 12 to the center of the opening 12*a*. Consequently, the supporting frame 13 divides the opening 12*a*, formed by the outer frame 12, into 4 openings 12*a*. Hence, the overall shape of the reinforcing frame 11 may look like a lattice shape. The openings 12*a* may reduce the total weight of the supporting plate 10 by minimizing the frame that substantially supports the PDP 2.

The reinforcing frame 11 may have connecting holes 12*b* at positions corresponding to the connecting holes 2*c* of the PDP 2. Therefore, the joining members 20 may couple the PDP 2 securely to the supporting plate 10 by passing through both the connecting holes 2*c* of the PDP 2 and the connecting holes 12*b* of the reinforcing frame 11. Here, the connecting holes 2*c* and the connecting holes 12*b* may be circular holes that match the cylindrical-shaped joining members 20.

In order to reduce EMI, the molding 15 may be made from a plastic material having electrical conductivity, such as a conventional conductive polymer. The molding 15 may be made by extrusion forming, and it closes the openings 12*a* of the reinforcing frame 11 and encompasses the entire reinforcing frame 11, except the connecting holes 12*b* in order to install the driving circuit boards 4.

Figure 3:
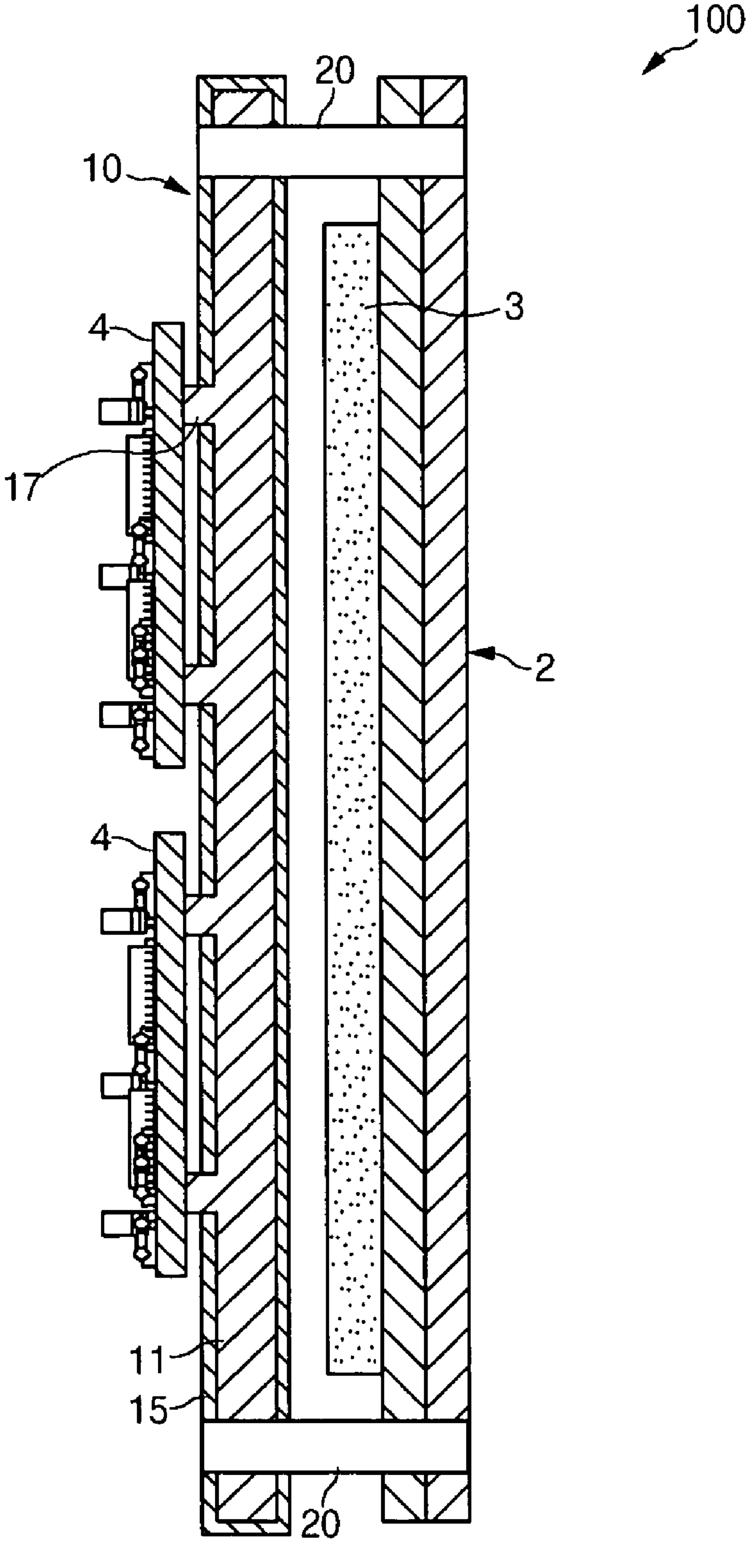
FIG. 3 is a side cross-sectional view showing the assembled PDP and the supporting plate of FIG. 1.

In the first exemplary embodiment, as FIG. 3 shows, a plurality of mounts 17, for installing the driving circuit boards 4, may be formed on a side of the supporting plate 10 facing away from the PDP 2. The mount 17 protrudes from the surface of the molding 15. The mount 17 may be formed as a single body with the molding 15 by extrusion forming, or it may be a separate fixing means, like a boss, that is attached on the surface of the molding 15.

The plasma display apparatus 100 may be assembled as follows. First, the driving circuit boards 4 may be installed on the mounts 17 of the supporting plate 10. Second, the supporting plate 10 is placed parallel to the PDP 2, and the joining members 20 may be inserted through the connecting holes 2*c* of the PDP 2 to the connecting holes 12*b* of the supporting plate 10 while the PDP 2 and the supporting plate 10 are pressed together. Coupling the front cabinet 5 and the rear cover 6 to the supporting plate 10 completes the apparatus' assembly. The PDP 2 and the supporting plate 10 may be separated from each other with a predetermined space by the joining members 20. In particular, when the plasma display apparatus 100 is mounted on a wall, no additional wall-mounted bosses may be required because the joining members 20 may be fixed with the wall directly.

In accordance with the first exemplary embodiment of the present invention, the plasma display apparatus 100 may be lighter and cheaper to manufacture than conventional apparatuses. This is because the supporting plate 10 utilizes the minimized reinforcing frame 11, which may be as strong as the conventional chassis base and substantially supports the PDP 2, and the molding 15, which is made of a plastic material and encompasses the reinforcing frame 11. Whereas a conventional apparatus may use a joining member, such as double-sided tape between the PDP and the chassis base, the plasma display apparatus 100 of the present invention may improve reliability by utilizing the joining members 20 passing through the PDP 2 and the supporting plate 10, which may result in a more accurate and secure assembly. Furthermore, the joining members 20 allow separation between the PDP 2 and the supporting plate 10, which provides a space where air may flow by natural convection for efficient heat dissipation from the PDP 2 and the driving circuit boards 4.

Figure 5:
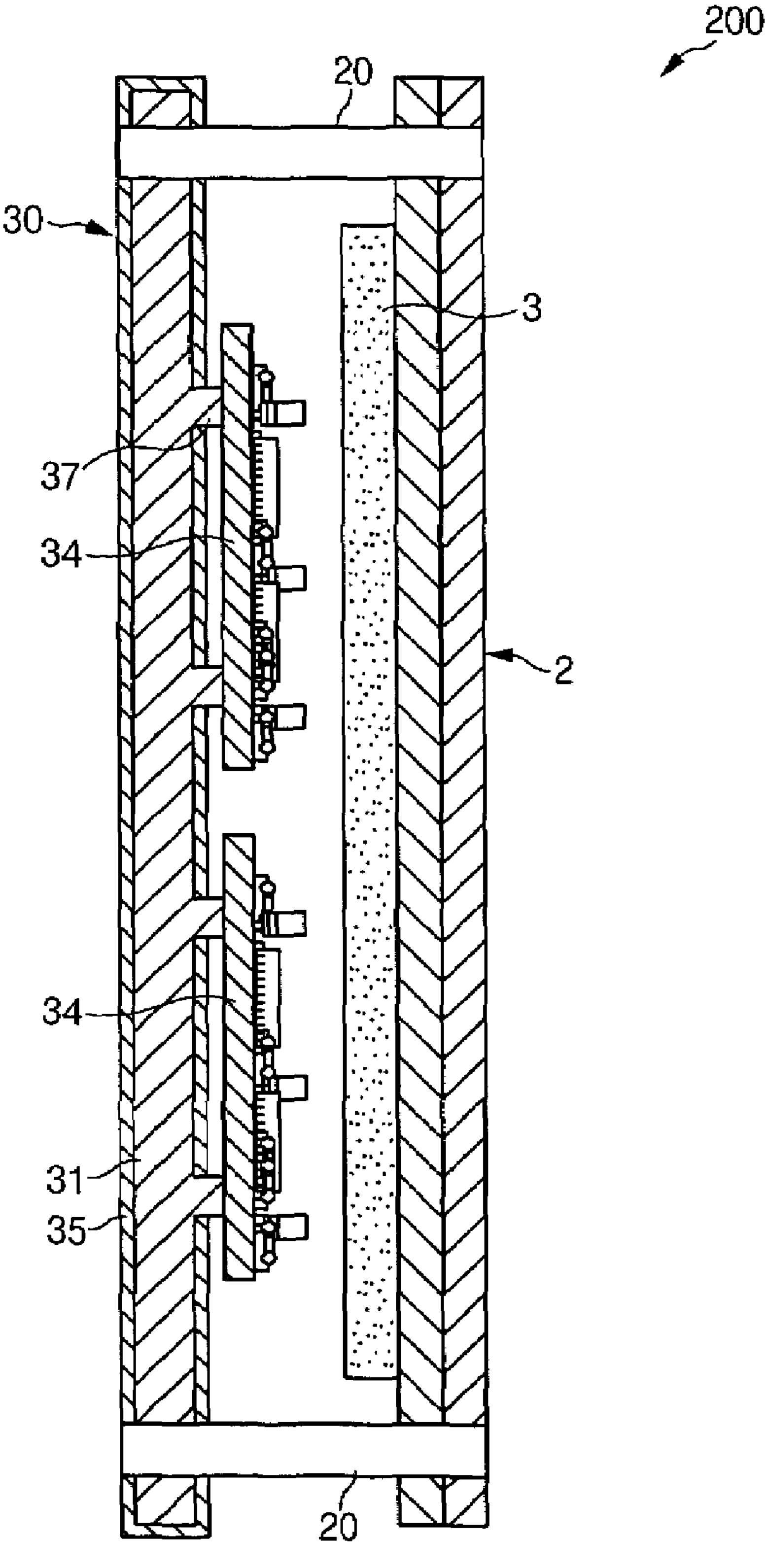
FIG. 5 is a side cross-sectional view showing an assembled PDP and supporting plate according to a second exemplary embodiment of the present invention.

FIG. 5 is a side cross-sectional view showing the plasma display apparatus 200 according to a second exemplary embodiment of the present invention. Components of FIG. 5 performing the same functions as those of FIG. 3 will have the same reference numbers as those of FIG. 3.

As FIG. 5 shows, the second exemplary embodiment of the present invention is similar to the first exemplary embodiment except that driving circuit boards 34 are located between the PDP 2 and a supporting plate 30.

In the plasma display apparatus 200 of the second exemplary embodiment, the PDP 2 and the supporting plate 30 are separated from each other, and a plurality of mounts 37 for installing the driving circuit boards 34 may be formed on the side of the supporting plate 30 facing the PDP 2.

Other components are the same as those in the first exemplary embodiment and their detailed explanations are omitted.

As FIG. 5 shows, the driving circuit boards 34 may be located in the space between the PDP 2 and the supporting plate 30. Hence, low temperature, outside air may be drawn into the space from below due to natural convection, which may enhance the heat dissipation from the PDP 2 and the driving circuit boards 34. The supporting plate 30 may include a reinforcing frame 31, which substantially supports the PDP 2, and a molding 35, which encompasses the entire reinforcing frame 31.

Furthermore, the plasma display apparatus 200 may be better suited for a wall-mounted display because the major heat dissipation takes place in the space between the PDP 2 and the supporting plate 30, and little heat is dissipated toward the wall.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:

a plasma display panel (PDP);

a supporting plate behind the PDP; and a joining member connecting the PDP to the supporting plate by passing through the PDP and the supporting plate, wherein the PDP comprises a front glass substrate and a rear glass substrate, the joining member passing through both the front glass substrate and the rear glass substrate.

2. The plasma display apparatus of claim 1, wherein the supporting plate comprises:

a reinforcing frame having an opening facing an area of the PDP, the reinforcing frame being surrounded by an edge of the PDP; and a molding encompassing the reinforcing frame and closing the opening.

3. The plasma display apparatus of claim 1, wherein the PDP and the supporting plate are separated from each other.

4. The plasma display apparatus of claim 3, further comprising:

a driving circuit board coupled to the supporting plate, wherein the supporting plate is between the driving circuit board and the PDP.

5. The plasma display apparatus of claim 3, further comprising:

a driving circuit board coupled to the supporting plate, wherein driving circuit board is between the supporting plate and the PDP.

6. The plasma display apparatus of claim 1, wherein a connecting hole is formed along an edge of the PDP and the supporting plate, and the joining member is inserted into the connecting hole.

7. The plasma display apparatus of claim 2, wherein the reinforcing frame comprises:

an outer frame facing edges of the PDP and forming the opening therein; and a supporting frame, extending inwardly from the outer frame, to divide the opening into at least two openings.

8. The plasma display apparatus of claim 2, wherein the reinforcing frame is made of a metallic material.

9. The plasma display apparatus of claim 2, wherein the molding is made of a plastic material having electrical conductivity.

10. The plasma display apparatus of claim 1, further comprising a thermal conduction medium between the PDP and the supporting plate.

11. The plasma display apparatus of claim 10, wherein the thermal conduction medium is a silicone sheet attached to the PDP.

12. The plasma display apparatus of claim 1, further comprising:

a mount formed on a side of the supporting plate; and a driving circuit board coupled to the mount.

13. The plasma display apparatus of claim 1, further comprising:

a front cabinet in front of the PDP; and a rear cover at a rear of the supporting plate and covering the supporting plate.

14. The plasma display apparatus of claim 13, wherein the front cabinet has a conductive film filter on an inside of the front cabinet facing the PDP.

15. The plasma display apparatus of claim 1, wherein the joining member is a cylindrical pin.

16. The plasma display apparatus of claim 1, wherein the joining member is a screw.

17. The plasma display apparatus of claim 1, wherein the joining member has a cylindrical or polygonal cross-sectional shape.

18. The plasma display apparatus of claim 1, wherein the PDP and the supporting plate each comprise four corners, the four corners of the supporting plate overlapping with the four corners of the PDP, respectively.

19. The plasma display apparatus of claim 1, wherein the supporting plate comprises a rectangular plate arranged parallel to the PDP.

* * * * *